United States Patent
Yamazaki

(10) Patent No.: US 8,318,567 B2
(45) Date of Patent: Nov. 27, 2012

(54) THERMAL TREATMENT EQUIPMENT AND METHOD FOR HEAT-TREATING

(75) Inventor: Shunpei Yamazaki, Tokyo (JP)

(73) Assignee: Semiconductor Energy Laboratory Co., Ltd. (JP)

( * ) Notice: Subject to any disclaimer, the term of this patent is extended or adjusted under 35 U.S.C. 154(b) by 0 days.

(21) Appl. No.: 13/016,385

(22) Filed: Jan. 28, 2011

(65) Prior Publication Data

US 2011/0201169 A1    Aug. 18, 2011

Related U.S. Application Data

(60) Division of application No. 12/190,954, filed on Aug. 13, 2008, now Pat. No. 7,879,693, which is a continuation of application No. 11/371,273, filed on Mar. 8, 2006, now Pat. No. 7,923,352, which is a division of application No. 10/706,357, filed on Nov. 12, 2003, now Pat. No. 7,022,589, which is a division of application No. 10/156,873, filed on May 29, 2002, now Pat. No. 6,649,544.

(30) Foreign Application Priority Data

Jun. 1, 2001 (JP) .................................. 2001-167422

(51) Int. Cl.
*H01L 21/336* (2006.01)
(52) U.S. Cl. .. 438/297; 438/199; 438/294; 257/E21.409
(58) Field of Classification Search .................. 438/199, 438/294, 297, 514
See application file for complete search history.

(56) References Cited

U.S. PATENT DOCUMENTS 3,920,481 A * 11/1975 Hu ................................. 438/227
(Continued)

FOREIGN PATENT DOCUMENTS

EP    0 936 662 A2    8/1999
(Continued)

OTHER PUBLICATIONS

Office Action re Korean Patent Application No. KR 2008-0056404, dated Jul. 25, 2008 (with English translation).

*Primary Examiner* — Alexander Ghyka
(74) *Attorney, Agent, or Firm* — Husch Blackwell LLP

(57) ABSTRACT

The invention provides a method for activating impurity element added to a semiconductor and performing gettering process in shirt time, and a thermal treatment equipment enabling to perform such the heat-treating. The thermal treatment equipment comprises treatment rooms of n pieces (n>2) performing heat-treating, a preparatory heating room, and a cooling room, and heating a substrate using gas heated by heating units of n pieces as a heating source, wherein a gas-supplying unit is connected to a gas charge port of the cooling room, a discharge port of the cooling room is connected to a first gas-heating unit through a heat exchanger, a charge port of an m-th ($1 \leq m \leq (n-1)$) treatment room is connected to a discharge port of an m-th gas-heating unit, a charge port of an n-th treatment room is connected to a discharge port of an n-th gas-heating unit, a discharge port of the n-th treatment room is connected to the heat exchanger, and discharge port of the heat exchanger is connected to gas charge port of the preparatory heating room.

11 Claims, 9 Drawing Sheets

U.S. PATENT DOCUMENTS

| | | | |
|---|---|---|---|
| 4,027,380 A * | 6/1977 | Deal et al. | 438/227 |
| 5,376,587 A * | 12/1994 | Buchmann et al. | 438/122 |
| 5,587,330 A | 12/1996 | Yamazaki | |
| 5,753,548 A * | 5/1998 | Yu et al. | 438/231 |
| 5,893,730 A | 4/1999 | Yamazaki et al. | |
| 5,997,286 A | 12/1999 | Hemsath et al. | |
| 6,013,544 A | 1/2000 | Makita et al. | |
| 6,059,567 A | 5/2000 | Bolton et al. | |
| 6,133,073 A | 10/2000 | Yamazaki et al. | |
| 6,140,667 A | 10/2000 | Yamazaki et al. | |
| 6,204,194 B1 | 3/2001 | Takagi | |
| 6,291,275 B1 | 9/2001 | Yamazaki et al. | |
| 6,310,327 B1 | 10/2001 | Moore et al. | |
| 6,337,259 B1 | 1/2002 | Ueda et al. | |
| 6,348,368 B1 | 2/2002 | Yamazaki et al. | |
| 6,399,454 B1 | 6/2002 | Yamazaki | |
| 6,427,462 B1 | 8/2002 | Suenaga et al. | |
| 6,436,745 B1 | 8/2002 | Gotou et al. | |
| 6,458,637 B1 | 10/2002 | Yamazaki et al. | |
| 6,474,986 B2 | 11/2002 | Oda et al. | |
| 6,512,206 B1 | 1/2003 | McEntire et al. | |
| 6,605,497 B2 | 8/2003 | Yamazaki et al. | |
| 6,645,827 B2 * | 11/2003 | Nakamura | 438/452 |
| 6,649,544 B2 | 11/2003 | Yamazaki | |
| 6,825,072 B2 | 11/2004 | Yamazaki et al. | |
| 6,890,805 B2 | 5/2005 | Yamazaki et al. | |
| 6,962,837 B2 | 11/2005 | Yamazaki | |
| 7,022,589 B2 | 4/2006 | Yamazaki | |
| 7,118,780 B2 | 10/2006 | Yamazaki et al. | |
| 7,129,120 B2 | 10/2006 | Yamazaki | |
| 7,166,500 B2 | 1/2007 | Yamazaki et al. | |
| 7,439,121 B2 * | 10/2008 | Ohmi et al. | 438/211 |
| 2002/0000242 A1 | 1/2002 | Matsushita et al. | |
| 2002/0034863 A1 | 3/2002 | Yamazaki et al. | |
| 2002/0040981 A1 | 4/2002 | Yamazaki et al. | |
| 2002/0090765 A1 | 7/2002 | Yamazaki et al. | |
| 2002/0134530 A1 | 9/2002 | Giacobbe | |
| 2002/0179283 A1 | 12/2002 | Suenaga et al. | |
| 2003/0211669 A1 | 11/2003 | Yamazaki et al. | |
| 2005/0095760 A1 | 5/2005 | Yamazaki et al. | |
| 2005/0189592 A1 | 9/2005 | Yamazaki et al. | |
| 2006/0160333 A1 | 7/2006 | Yamazaki | |
| 2006/0273408 A1 * | 12/2006 | Kamiyama et al. | 257/401 |
| 2008/0032514 A1 * | 2/2008 | Sano et al. | 438/785 |
| 2008/0311286 A1 | 12/2008 | Yamazaki | |

FOREIGN PATENT DOCUMENTS

| | | |
|---|---|---|
| JP | 63-46380 | 2/1988 |
| JP | 63-197343 | 8/1988 |
| JP | 3-76227 | 4/1991 |
| JP | 3-102818 | 4/1991 |
| JP | 4-44314 | 2/1992 |
| JP | 4-337628 | 11/1992 |
| JP | 5-206044 | 8/1993 |
| JP | 5-299364 | 11/1993 |
| JP | 6-151414 | 5/1994 |
| JP | 8-213635 | 8/1996 |
| JP | 10-55951 | 2/1998 |
| JP | 10-229078 | 8/1998 |
| JP | 11-31660 | 2/1999 |
| JP | 11-204535 | 7/1999 |
| JP | 11-260728 | 9/1999 |
| JP | 2000-3918 | 1/2000 |
| JP | 2000-105081 | 4/2000 |
| JP | 2000-133606 | 5/2000 |
| JP | 2000-223416 | 8/2000 |
| JP | 2001-135573 | 5/2001 |
| JP | 2002-289518 | 10/2002 |
| KR | 1997-0063762 | 9/1997 |
| KR | 1999-016246 | 3/1999 |
| KR | 1999-0037169 | 5/1999 |
| KR | 1999-0037250 | 5/1999 |
| KR | 1999-0053882 | 7/1999 |
| KR | 10-0220207 | 9/1999 |
| KR | 1999-0072527 | 9/1999 |
| KR | 2002-0091313 | 12/2002 |

* cited by examiner

THERMAL TREATMENT EQUIPMENT AND METHOD FOR HEAT-TREATING

This application is a divisional of application Ser. No. 12/190,954 filed on Aug. 13, 2008 now U.S. Pat. No. 7,879,693 which is a continuation of application Ser. No. 11/371,273 filed on Mar. 8, 2006 now U.S. Pat. No. 7,923,352 which is a divisional of application Ser. No. 10/706,357 filed on Nov. 12, 2003 (now U.S. Pat. No. 7,022,589 issued Apr. 4, 2006) which is a divisional of prior application Ser. No. 10/156,873 filed on May 29, 2002 (now U.S. Pat. No. 6,649,544 issued Nov. 18, 2003).

BACKGROUND OF THE INVENTION

The present invention relates to a method for heat-treating and a thermal treatment equipment applying the method. Particularly, the invention relates to the thermal treatment equipment heating a substrate or a formed matter on the substrate by heated gas and the method for heat-treating using the equipment.

In a manufacturing process of a semiconductor device, thermal treatments aiming at oxidation, diffusion, gettering, and recrystallization after ion injection with respect to a semiconductor or a semiconductor substrate are programmed. A typical example of the equipment performing these thermal treatments is a hot wall type annealing furnace of horizontal type or vertical type, which is used widely.

The annealing furnace of horizontal type or vertical type is batch type equipment treating many substrates in a lump. For example, the vertical annealing furnace mounts a substrate on a susceptor formed by quartz horizontally and in parallel, and performs putting in and out to a reaction pipe by an elevator driving up and down. At outer circumference portion of a bell jar type reaction pipe, a heater is provided so as to heat a substrate by the heater. It takes comparatively long time for rising time reaching the predetermined heating temperature and falling time cooling to temperature possible to take out because of the construction thereof.

Incidentally, in MOS transistor used for an integrated circuit, very high process accuracy is required as elements become fine. Especially, it needs to diffuse impurity at the minimum for forming thin junction. However, process taking long time for rising temperature and falling temperature as the annealing furnace makes forming thin junction difficult.

Rapid thermal anneal (described RTA hereafter) method is developed as thermal treatment technique performing rapid heating and rapid cooling. An RTA equipment heats a substrate or a formed matter on the substrate rapidly using infrared ray lamp so as to perform thermal treatment in short time.

A thin film transistor (described TFT hereafter) is well known as another form of a transistor.

The TFT is paid attention as technique possible to form an integrated circuit directly on a glass substrate. The technique is advanced for application development for new electronic device such as a liquid crystal display device. Especially, the FET forming impurity domains such as a source domain and a drain domain on a polycrystal semiconductor film formed on the glass substrate needs thermal treatment for activating and easing of distortion. However, the glass substrate has demerits that distortion point thereof is only 600 to 700° C. and it is broken easily by thermal shock.

In the vertical or horizontal type annealing furnace of the related art, it becomes difficult to obtain uniformity of heating temperature when size of the substrate is large regardless of whether substrate forming the integrated circuit is semiconductor or insulation material such as glass or ceramic. In order to obtain uniformity of temperature in substrate surface and between substrates, it needs to make pitch of treated substrate mounting horizontally and in parallel wide because of characteristic of gas flowing in the reaction pipe as fluid. For example, when a side of the substrate exceeds 500 mm, pitch of the substrate is necessary to take more than 30 mm.

Therefore, as the treated substrate is large, the equipment is necessarily large size. Because many substrates are treated in a lump, weight of substrates themselves increases, and susceptor mounting the treated substrate needs strength. Because of that, the weight increases, and operation of the machine carrying in and out the treated substrate becomes slow. Further, the instrument influences not only to increase of floor area occupied by the thermal treatment equipment but also to building cost for a building having withstand load of the floor. Thus, large sized equipment forms a vicious circle.

On the other hand, the RTA method processes piece by piece as premise so that load of the equipment does not increase extremely. However, difference in absorptance of lamp of light used for heating unit generates because of characteristic of the treated substrate and the formed matter thereon. For example, when a pattern of metal wiring is formed on the glass substrate, a phenomenon that the metal wiring is heated earlier and the glass substrate is broken by local distortion generates. Because of that, complex control such as adjusting rising speed is required.

The invention is aimed at solution of the problem, that is, the object of the invention is to provide a method activating impurity element added to semiconductor by short time thermal treatment and performing gettering process, and a thermal treatment equipment possible to perform such the thermal treatment.

SUMMARY OF THE INVENTION

In order to solve the above-mentioned problem, A construction of thermal treatment equipment of the invention comprises treatment rooms of n pieces (n>2) performing heat-treating, a preparatory heating room, and a cooling room, and heating a substrate using gas heated by heating units of n pieces as a heating source, wherein a gas-supplying unit is connected to a gas charge port of the cooling room, a discharge port of the cooling room is connected to a first gas-heating unit through a heat exchanger, a charge port of an m-th ($1 \leq m \leq (n-1)$) treatment room is connected to a discharge port of an m-th gas-heating unit, a charge port of an n-th treatment room is connected to a discharge port of an n-th gas-heating unit, a discharge port of the n-th treatment room is connected to the heat exchanger, and a discharge port of the heat exchanger is connected to a gas charge port of the preparatory heating room.

Number of the treatment rooms connecting with gas pipes is option. That is, another construction of thermal treatment equipment of the invention comprises treatment rooms and gas-heating rooms of n pieces (n>2), wherein a charge port of an m-th ($1 \leq m \leq (n-1)$) treatment room is connected to a discharge port of an m-th gas-heating unit, a charge port of an n-th treatment room is connected to a discharge port of an n-th gas-heating unit, a discharge port of the n-th treatment room is connected to the heat exchanger, and a substrate is heated by gas heated by the heating unit as a heating source.

By heating the treated substrate by heated gas, the substrate is heated uniformly without being influenced by material of formed matter on the treated substrate. Thus, thermal treatment is possible without generating local distortion, and it is easy to achieve even thermal treatment of breakable substrate such as glass by rapid heating.

By providing a preparatory heating room and a cooling room except the treatment room performing thermal treatment, needless energy consumption is reduced. That is, by charging cool (about room temperature) gas supplied from a gas-supplying unit to the cooling room, the substrate having finished heat-treating is cooled. Thus, although temperature of the gas rises, thermal energy for heating gas is saved by supplying the gas to the gas-heating unit through the heat exchanger. By charging high gas in temperature discharged from the heat exchanger to the preparatory heating room and heating the cooled (about room temperature) substrate, time for heating at the treatment room is shortened, and temperature change of heating gas is made small. Thus, thermal energy for gas heating is saved.

A method for heat-treating by the thermal treatment equipment comprises treatment rooms of n pieces (n>2) performing heat-treating, a preparatory heating room, and a cooling room, and heating a substrate using gas heated by heating units of n pieces as a heating source, wherein gas heated by an m-th ($1 \leq m \leq (n-1)$) heating unit is supplied to an m-th treating room by treating rooms and gas-heating units of n pieces (n>2), gas supplied to the m-th treatment room is heated by an (m+1)-th heating unit and is supplied to an (m+1)-th treatment room, substrates arranged at the treatment room of n pieces are heated, gas supplied to an n-th treatment room is supplied to a heat exchanger, gas supplied from a gas-supplying unit is used as a heating source for heating, gas supplied from the gas-supplying unit is supplied to the cooling room, gas discharged from the cooling room is supplied to a first gas-heating unit through the heat exchanger, and gas discharged from the heat exchanger is supplied to the preparatory heating room.

By providing a preparatory room and a cooling room, time for heat-treating is shortened. By combining with batch type process system treating plural substrates in a lump, large quantity of substrates can be treated efficiently.

For gas applied in the invention, inactive gas by nitrogen or noble gas, reducing gas of hydrogen, oxidizing gas of oxygen, dinitrogen monoxide, or nitrogen dioxide is used.

Using inactive gas by nitrogen or noble gas is applicable for thermal treatment aiming at thermal treatment for crystallization of amorphous semiconductor film, thermal treatment for gettering, and recrystallization and activation after ion injection or ion doping (method injecting ion without separating mass).

By using hydrogen or hydrogen diluted by inert gas as reduction gas such as hydrogen, hydrogen treating for compensating a defect of semiconductor (dangling bond) can be performed.

By using oxidizing gas such as oxygen, dinitrogen monoxide, and nitrogen dioxide, oxide film can be formed at semiconductor substrate or semiconductor film.

DETAILED DESCRIPTION OF PREFERRED EMBODIMENTS

Figure 1:
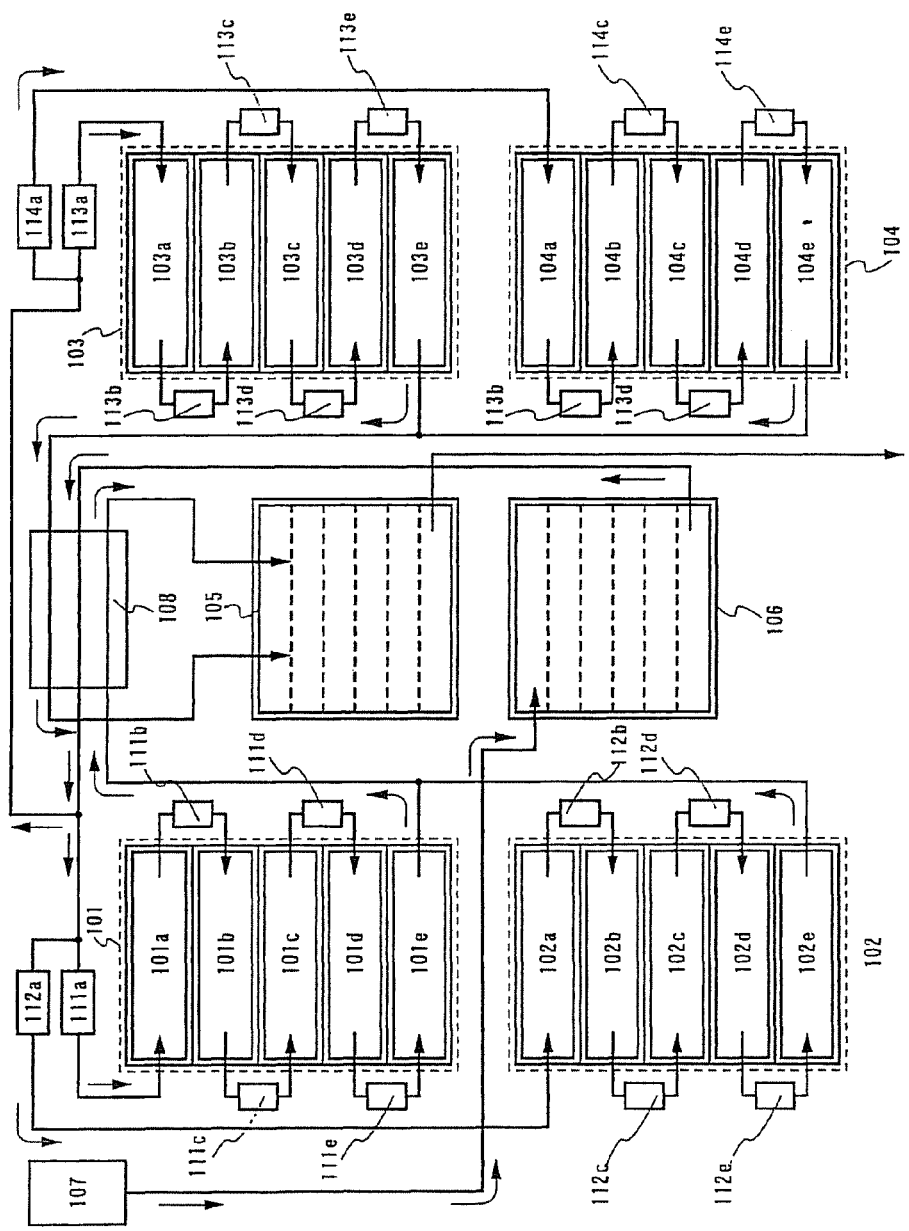
FIG. 1 is a sectional view showing a mode for carrying out of a thermal treatment equipment applying for a method for heat-treating of the invention.

Modes for carrying out the invention will be described below referring figures. FIG. 1 is a sectional view showing a mode for carrying out of a thermal treatment equipment applying for method for heat-treating of the invention. The thermal treatment equipment provides plural gas supplying units, plural gas heating units, plural treatment rooms and heat exchangers, a preparatory heating room, and a cooling room.

Gas supplied from a gas-supplying unit 107 is charged to the cooling room. A substrate having finished heating process is arranged in the cooling room for certain period. The supplied gas contributes to falling temperature of the substrate, thereby temperature of the gas supplied with about room temperature rises. When there is not the substrate having finished heating process, the gas passes through the room as it is.

The gas discharged from the cooling room passes through a thermal exchanger 108, and is supplied to a first gas-heating unit 111a or 112a. The first gas-heating unit 111a heats the gas at the predetermined temperature.

A discharge port of the second gas-heating unit 111b is connected to a charge port provided at a first process room 101a by a gas pipe, and the heated gas is supplied. In the first process room 101a, a substrate-holding unit and shower plate blowing heated gas to the substrate are provided. Then, the supplied gas is discharged from the discharge port provided at first process room 101a by heating the substrate.

In order to prevent contamination from wall material at charging of heated gas, the process room is formed using quartz or ceramic. As it is difficult to form the process room with quartz meeting the size of the substrate when it is large, the process room may be applied with ceramic at its case. The structure of the holding unit is made as small as possible in contact area with the substrate. The gas supplied to process room 101a is blown to the substrate passing through the shower plate. Small openings are formed at the shower plate at the predetermined pitch, the heated gas is blown uniformly to the substrate. By providing the shower plate, heating is performed uniformly even when area of the substrate is large.

Such the construction of the process room is similar as constructions of a second process room 101b, a third process room 101c, a fourth process room 101d, and a fifth process room 101e.

The gas discharged from the first process room 101a is used for heating the substrate again supplying to the second process room 101b after that. Since temperature of the gas falls at the process, control is performed so as to be the predetermined temperature by a second gas-heating unit 111b. The discharge port provided at the first process room 101a and the charge port of the second heating unit 111b are connected with a gas pipe, and the discharge port of the second heating unit 111b and the charge port provided at the second process room 101b are connected with a gas pipe. These gas pipes may be provided with a heat insulation unit, though not shown.

Similarly, the heated gas supplied to the second process room 101b is supplied to the third process room 101c through a third gas heating unit 111c after used for heating the substrate. The heated gas supplied to the third process room 101c is supplied to the fourth process room 101d through a fourth gas heating unit 111d after used for heating the substrate. The heated gas supplied to the fourth process room 101d is supplied to the fifth process room 101e through a fifth gas heating unit 111e after used for heating the substrate.

The gas discharged from the fifth process room 101e is supplied to the heat exchanger 108 and used for heating gas supplied to the first gas heating unit 111a from the cooling room 106. Further, after that, the gas is supplied to the preparatory heating room 105 and used for heating the substrate disposed therein.

The first to fifth process rooms are connected through gas heating units in a heat-treatment room 101 of FIG. 1. Construction of heat-treatment rooms 102, 103, and 104 too is similar as the heat-treatment room 101. It is possible to perform thermal treatment different in heating temperature at every heat-treatment room by such the construction. Number of connecting is option without limiting to the above.

The substrates are set at treatment room every sheet. By connecting each treatment room with gas pipe in series and flowing the heated gas continuously, quantity of the gas used and energy requiring for heating can be saved.

The heat exchanger 108 is provided for preheating gas supplying to the first gas-heating unit 111a from the first gas-supplying unit 107 previously. The gas can be heated previously by heat of the gas discharged from each treatment room.

Figure 5:
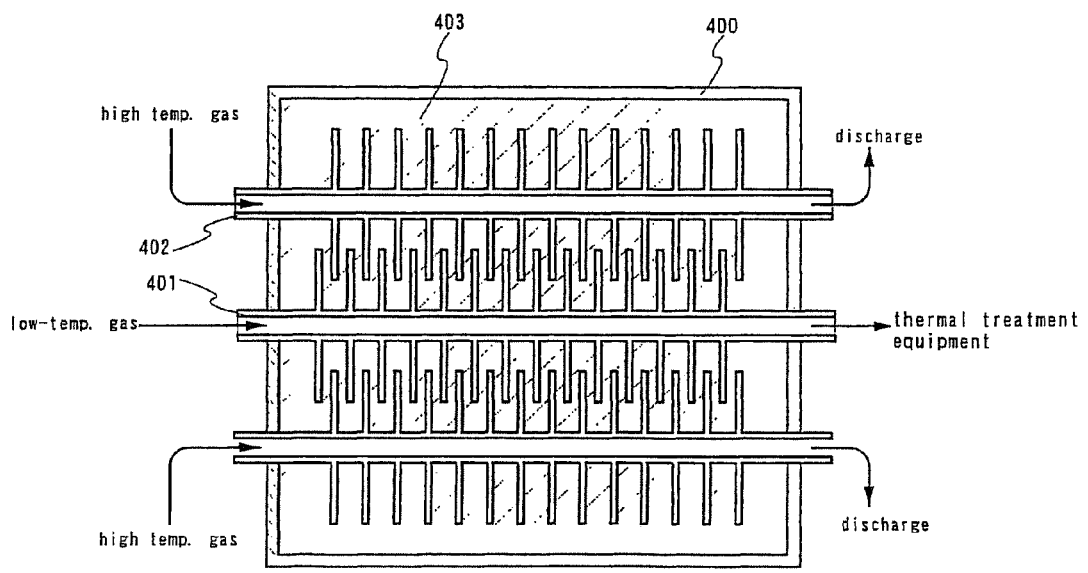
FIG. 5 is a view describing an example of a heat exchanger applicable for the thermal treatment equipment of the invention.

An example of the heat exchanger is shown in FIG. 5. A pipe where high temperature gas flows therethrough and a fin as shown in the figure is provided, and a pipe where cooled (about room temperature usually) gas flows therethrough and similarly a fin is provided are set up at the heat exchanger. Oil 403 is filled in a body of equipment 400 as a medium transmitting heat. The fin is provided for improvement of thermal exchange efficiency, and the high temperature gas transmits heat to the oil 403 and is discharged being made low temperature by such the construction. By the heat, low temperature gas is heated passing through the heat exchanger. Although a simple example of the heat exchanger is shown here, construction of heat exchanger applicable for thermal treatment equipment of the invention may adopt another construction without limiting to FIG. 5.

Figure 4:
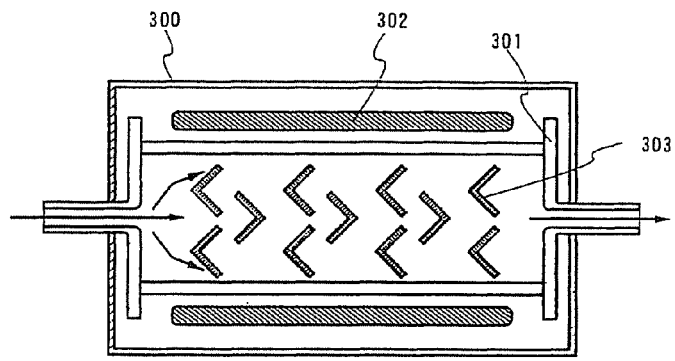
FIG. 4 is a view describing an example of gas heating unit applicable for the thermal treatment equipment of the invention.

FIG. 4 shows an example of a construction of a gas heating unit. In FIG. 4, a heat absorbing body 303 is provided at inside of a cylinder 301 letting gas pass. For the heat absorbing body 303, high purity titanium or tungsten, or matter formed by silicon carbide, quartz, or silicon is adopted. The cylinder 301 is formed by transparent quartz, and radiation of a light source 302 provided at outside of the cylinder heats the heat absorbing body 303. Although the gas is heated contacting the heat absorbing body 303, contamination is prevented by providing the light source at outside of the cylinder 301, and purity of passing gas can be kept. Inside of the body of equipment 300 may be evacuated so as to improve heat insulation effect.

Next, an example of process of thermal treatment using the thermal treatment equipment having the construction shown in FIG. 1 will be described. The substrate arranged at the preparatory heating room 105 is heated to the predetermined temperature by the gas supplied from the heat exchanger 108. Heating temperature is possible to set to about 100 to 450° C. For example, by heating to 450° C., dehydrogenation process of amorphous silicon film formed on the substrate is possible. The substrate heated at a preparatory heating room 105 is moved to each of treatment room 101a to 101e of the heat treatment room 101 and heat-treated there. The substrate is heated at the predetermined temperature by the first to fifth gas-heating units 111a to 111e.

After finishing thermal treatment of a certain time, the substrate is moved to the cooling room 106. Gas supplied from the gas supplying unit 107 and having temperature of about room temperature is supplied to the cooling room 106, thereby the substrate is cooled. Therefore, the substrate after thermal treatment arranged at the cooling room 106 can be cooled rapidly. The gas absorbs heat of the substrate so as to rise to temperature higher than the room temperature. The gas is supplied to the first heating unit 111a after heated by the heat exchanger 108. The substrate cooled to the predetermined temperature is collected.

By the preparatory heating room and the cooling room, it is possible to perform preparatory heating and cooling at the same time, thereby sheets of treatment per unit time can be increased.

In order to save quantity of used gas and to improve thermal efficiency, it is desirable to make content volume of the treatment room as small as possible. Size of inside of the treatment room is determined by size of the substrate and operating range of a transferring unit putting in and out the substrate. Although operating range of about 10 mm is required in order that the transferring unit puts in and out the substrate, size of one side of the treatment rooms is determined by thickness of the substrate and the minimum operating range of the transferring unit.

Although the method for heat-treating and the thermal treatment equipment applying the method of the invention perform batch process as a premise, it is possible to raise temperature in comparatively short time to heat directly the treated substrate by heating gas and to lower temperature rapidly by cooling the treated substrate of high temperature state by gas of about room temperature. Although attention is need when a weak substrate in thermal shock such as glass is used, it differs from instant heating of several micro sec to several sec by light of a lamp as the RTA of the related art, thereby the substrate is not damaged by rapid heating.

Gas used for heating or cooling can be selected by use of thermal treatment. Using nitrogen or inert gas by noble gas is applicable for thermal treatment aiming at thermal treatment for crystallization of amorphous semiconductor film, thermal treatment for gettering, and recrystallization and activation after ion injection or ion doping (method injecting ion without separating mass). By using hydrogen or hydrogen diluted by inert gas, as reduction gas such as hydrogen, hydrogen treating for compensating a defect of semiconductor (dangling bond) can be performed. By using oxidizing gas such as oxygen, dinitrogen monoxide, and nitrogen dioxide, oxide film can be formed at semiconductor substrate or semiconductor film.

The thermal treatment equipment applying the method for heat-treating of the above-mentioned invention can apply for various thermal treatment of the processed matter. For example, it is applied for thermal treatment of semiconductor substrate forming an integrated circuit, thermal treatment of an insulation substrate forming a TFT, and thermal treatment of a metal substrate. For example, it is applied for thermal treatment of a glass substrate forming a TFT. Even applying for not only 600×720 mm but also 1200×1600 mm in the size of the substrate, the substrate can be heated uniformly. Further, it is needless to make the jig holding the substrate large.

EMBODIMENT MODE

Embodiment 1

Figure 2:
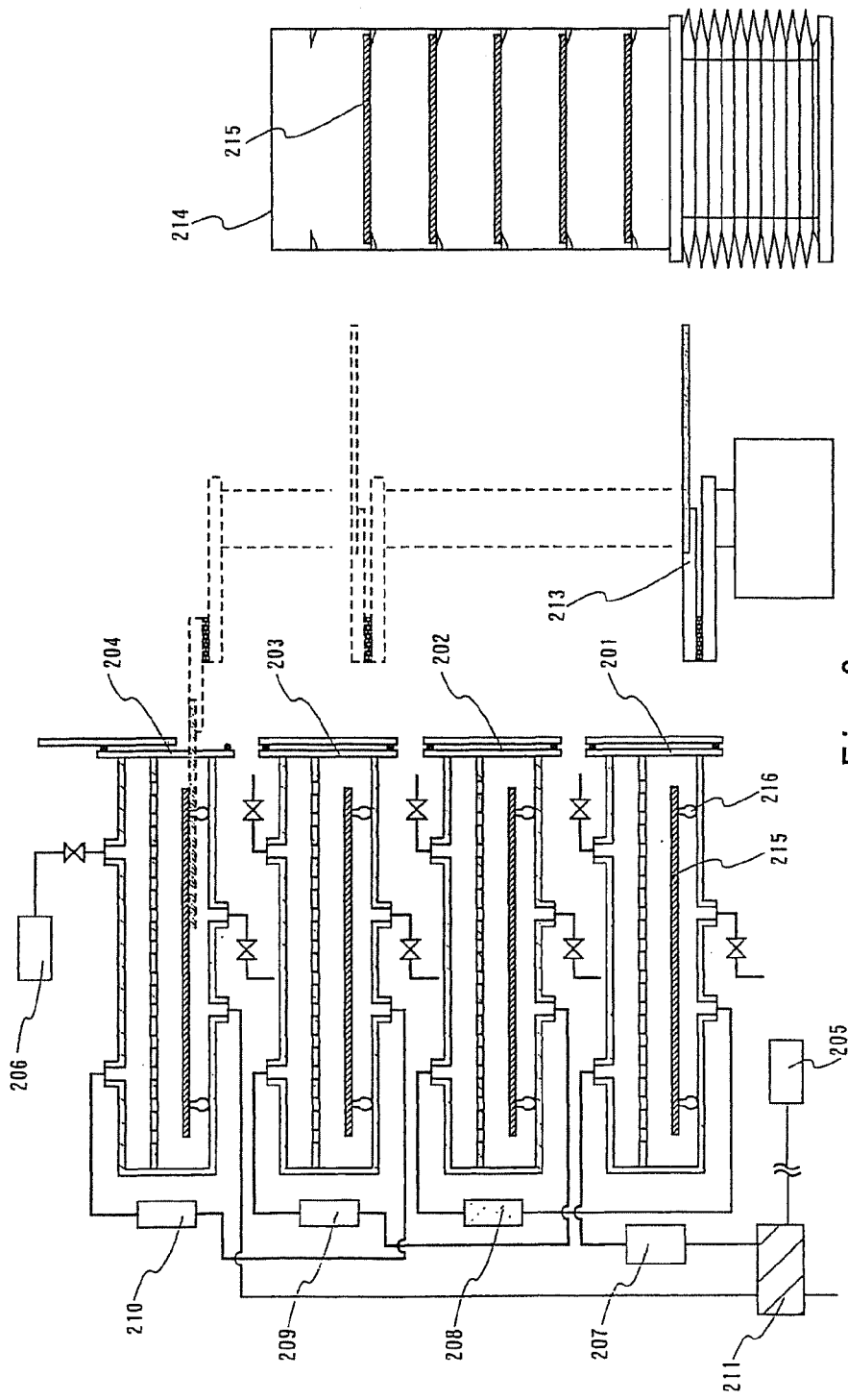
FIG. 2 is a sectional view showing a mode for carrying out of the thermal treatment equipment applying for the method for heat-treating of the invention.

FIG. 2 shows an embodiment of thermal treatment equipment of the invention. In FIG. 2, a first gas-heating unit 208 is provided corresponding to a first treatment room 201, a second gas-heating unit 209 is provided corresponding to a second treatment room 202, a third gas-heating unit 210 is provided corresponding to a third treatment room 203, a fourth gas-heating unit 211 is provided corresponding to a fourth treatment room 204, and a fifth gas-heating unit 212 is provided corresponding to a fifth treatment room 205. A first gas-supplying unit 206, a second gas-supplying unit 207, and a heat exchanger 213 are formed, and these pipe arrangements have the similar construction as the thermal treatment equipment described in the mode for carrying out.

The first gas-supplying unit 206 supplies heating gas to the heat exchanger 213 here through a cooling room not shown. The gas discharged from the heat exchanger 213 is supplied to a preparatory heating room not shown.

Substrates 218 held by a cassette 217 are transferred to each treatment room by a transferring unit 216, and are set on a holding unit 215. Each treatment room puts in and out the substrate by opening/closing of a gate valve.

Figure 3:
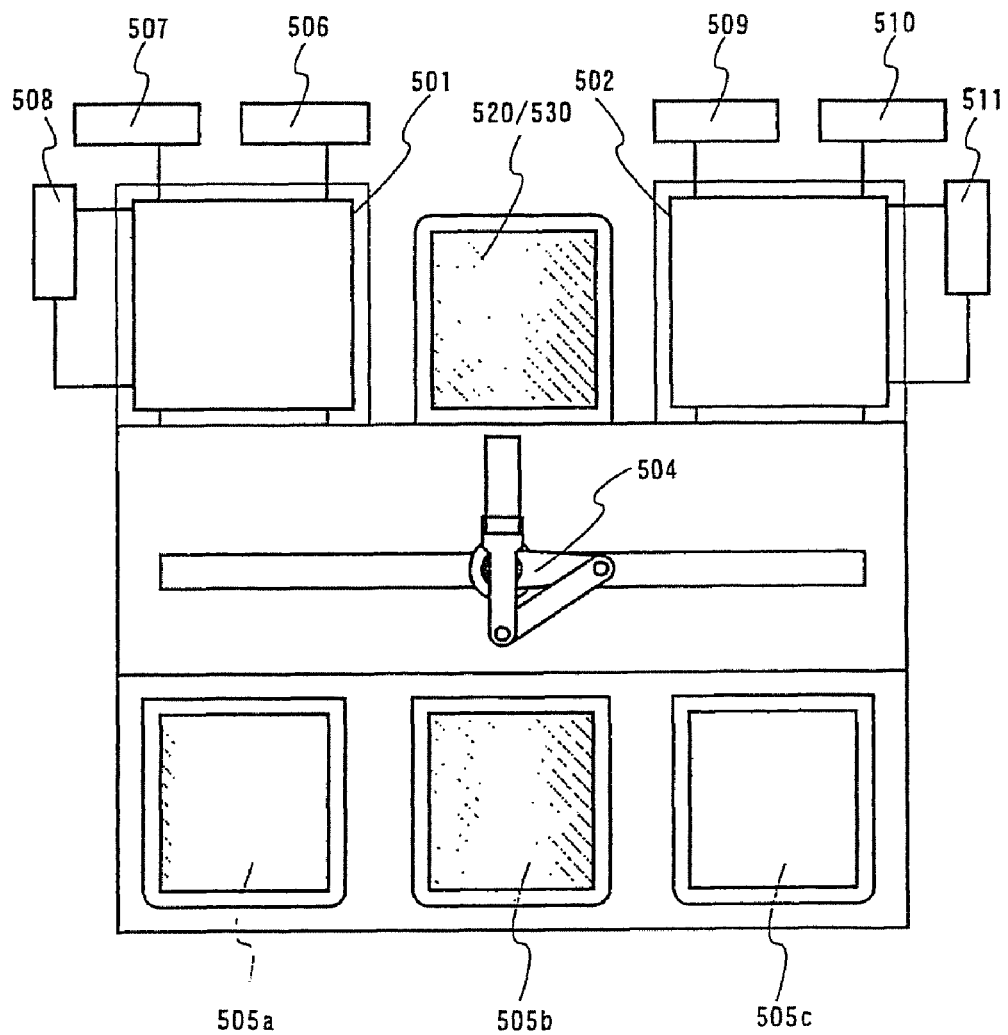
FIG. 3 is a layout view showing an example of the thermal treatment equipment applying for the method for heat-treating of the invention.

FIG. 3 shows a construction of a thermal treatment equipment providing plural treatment rooms. Heat treatment rooms 501 and 502, first gas-supplying units 506 and 509, second gas-supplying unit 507 and 510 and gas-heating units 508 and 511 are provided. The heat treatment rooms 501 and 502 are piled in plural stages, and gas-heating units are provided corresponding to the room. Such the construction may be referred to FIG. 2. A preparatory heating room 520 and a cooling room 530 are arranged longitudinally between the heat treatment rooms 501 and 502. Cassettes 505a to 505c are applied for holding and transferring the substrate. The substrate is used for moving through the cassettes 505a to 505c, the heat treatment rooms 501 and 502, the preparatory heating room 520, and the cooling room 530 by the transferring unit 504.

Number of stages of the treatment room is determined by time for thermal treatment and operation speed of the transferring unit (that is, able speed to move the substrate). When tact time is about 10 minutes, three to ten stages are set for the heat treatment rooms 501 and 502.

Although FIG. 3 shows an example of the construction of the thermal treatment equipment by large quantity batch process system, it is possible to take any arrangement of others without limiting to the construction and the arrangement. Since the thermal treatment equipment shown in the embodiment is a batch process system and a system heating the treated substrate by heated gas, thermal treatment is performed uniformly even when size of the substrate is large. For example, it is applicable even for thermal treatment of the substrate longer than 1000 mm in length of one side.

Characteristic of method for heat-treating and the thermal treatment equipment using the method of the invention is to have no limitation of a shape of the treated substrate or a size. A strong susceptor is needless by sheet process even when the treated substrate is large, thereby making small can be designed for the size. A large scale heating unit is needless so as to save power consumption.

Embodiment 2

An example of thermal treatment accompanied by crystallization of semiconductor film and gettering using method for heat-treating and the thermal treatment equipment applying the method of the invention will be described using FIGS. 8A to 8F.

Figure 8A:
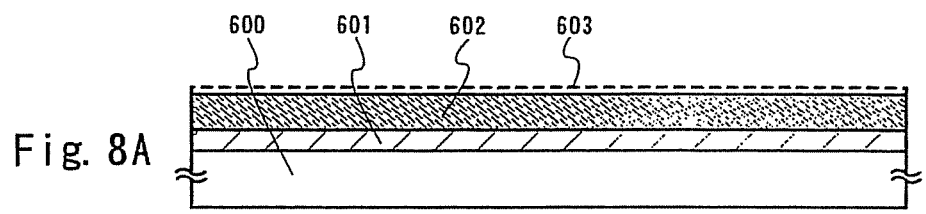
FIGS. 8A to 8F are sectional views describing process showing producing semiconductor film applying the method for heat-treating and thermal treatment equipment of the invention.

Although material of a substrate 600 is not limited especially in FIG. 8A, barium borosilicate glass, alminoborosilicate glass, or quartz are desirably used for the material. An inorganic insulation film of 10 to 200 nm thickness is formed at the surface of the substrate 600 for a blocking layer 601. An example of the suitable blocking layer is a silicon oxide nitride film produced by plasma CVD method, and a matter forming a first silicon oxide nitride film produced by $SiH_4$, $NH_3$, and $N_2O$ in 50 nm thickness and forming a second silicon oxide nitride film produced by $SiH_4$ and $N_2O$ in 100 nm thickness is used. The blocking layer 601 is provided so that alkali metal included in the glass substrate does not diffuse into semiconductor film forming at an upper layer thereof, and it is possible to omit at the case of a substrate of quartz.

For a semiconductor film (a first semiconductor film) 602 having amorphous structure forming on the blocking layer 601, semiconductor material having silicon for its main ingredients is used. Typically, amorphous silicon film or amorphous silicon germanium film is applied, and it is formed to 10 to 100 nm thickness by plasma CVD method, decompression CVD method, or sputtering method. In order to obtain good crystal, impurity concentration of oxygen and nitrogen included in the semiconductor film 602 having amorphous structure may be reduced less than $5×10^{18}/cm^3$. These impurities cause to disturb crystallization of amorphous semiconductor and to increase density of trapping center or recombination center even after crystallization. Because of that, it is desirable not only to use gas of high impurity material but also to use a CVD equipment for ultra high vacuum providing mirror process (electropolishing process) in the reaction room or evacuation system of oil free.

After that, a metal element having catalysis promoting crystallization is added to surface of the semiconductor film 602 having amorphous structure. Metal elements having catalysis promoting crystallization of the semiconductor film are ferrous (Fe), nickel (Ni), cobalt (Co), ruthenium (Ru), rhodium (Rh), palladium (Pd), osmium (Os), iridium (Ir), platinum (Pt), copper (Cu), gold (Au), etc., and one kind or plural kind selected from them is used. Typically, using nickel, nickel acetate solution including nickel of 1 to 100 ppm converted into weight is applied by a spinner so as to form a catalyst content layer 603. The more content quantity of nickel is, in the shorter time crystallization can be performed.

In this case, in order to adapt the solution, a very thin oxide film is formed by ozone content solution as a surface process of the semiconductor film 602 having amorphous structure, clean surface is formed by etching the oxide film with mixed liquor of hydrofluoric acid and hydrogen peroxide water, after that, a very thin oxide film is formed by processing again with the ozone content solution. Since surface of the semiconductor film such as silicon is originally hydrophobic, nickel acetate solution can be applied uniformly by forming the oxide film like this.

The catalyst content layer 603 may be formed by sputtering method, deposition method, and plasma process without limiting such the method. The catalyst content layer 603 may be formed before forming the semiconductor film 602 having amorphous structure, that is, on the blocking layer 601.

Figure 6:
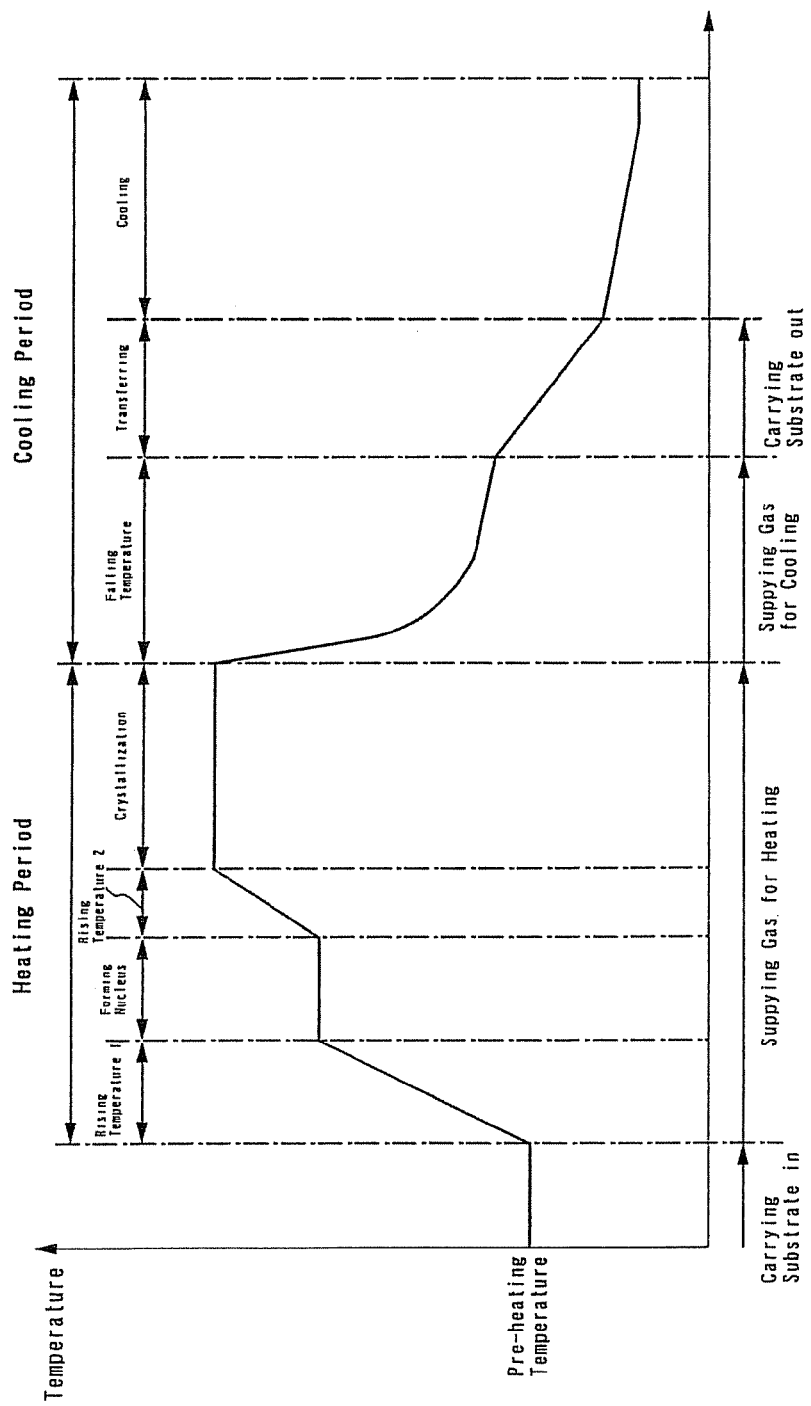
FIG. 6 is a graph describing change of substrate temperature at crystallization process using method for heat-treating of the invention.

Thermal treatment for crystallization is performed while keeping state contacting the semiconductor film 602 having amorphous structure and the catalysis content layer 603. The thermal treatment equipment shown in FIG. 1 is used for the thermal treatment. FIG. 6 is a graph describing process of the thermal treatment, and process of the thermal treatment will be described below referring the graph.

Nitrogen and argon are used for heating gas. The substrate 600 forming amorphous semiconductor film is moved to a preparatory heating room from a cassette by a transferring unit, and is heated previously to the predetermined temperature. After that, moving the substrate to a treatment room, a gate valve is closed. After closing the gate valve, letting heated nitrogen flow and filling in a reaction room with nitrogen, the substrate is heated.

Increasing quantity of flow of nitrogen, nitrogen gas supplied by a gas-heating unit is heated to first temperature. The heating temperature can be adjusted by electric power supplying to a heating element or supplying quantity of the power and nitrogen. Here, setting to 550±50° C. as the first temperature, the substrate is heated (step of rising temperature 1 shown in FIG. 6). Necessary time for rising to the temperature is only two minutes.

When temperature of the substrate becomes the first temperature, the state is kept for three minutes. At this step, crystal nucleus is formed at amorphous semiconductor film (step of forming nucleus shown in FIG. 6). After that, the substrate is heated to second temperature for crystallization. Raising temperature of nitrogen gas for heating to 675±25° C., the substrate is heated (step of rising temperature 2 shown in FIG. 6). When temperature of the substrate becomes the second temperature, keeping the temperature for five minutes, crystallization is performed (step of crystallization shown in FIG. 6). Of course, nitrogen gas for heating is continued to supply.

After the predetermined time, supply of nitrogen gas for heating is stopped, and nitrogen gas for cooling is supplied. The gas may be nitrogen gas having room temperature. Then the substrate is cooled rapidly (step of falling temperature shown in FIG. 6). The time is about three minutes. After cooling the substrate to 300° C., the substrate is put out from the treatment room by the transferring unit, and is moved to the cooling room. Here, the substrate is further cooled to less than 150° C. (step of transfer shown in FIG. 6). After that, by transferring the substrate to the cassette, thermal treatment for crystallization is finished.

Time for putting the substrate in the thermal treatment equipment and putting it out after heat-treating is 13 minutes. Thus, by using the thermal treatment equipment and the method for heat-treating of the invention, thermal treatment for crystallization can be performed in very short time.

Figure 8B:
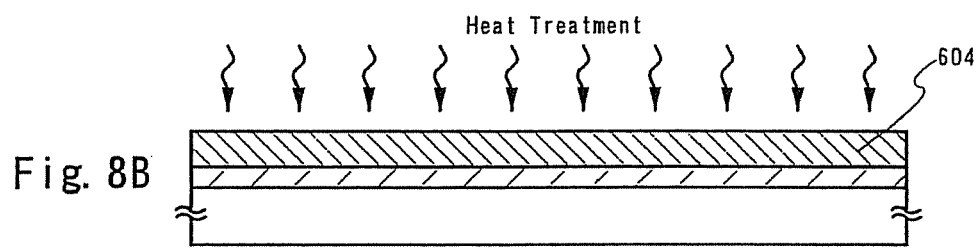

Thus, a semiconductor film (first semiconductor film) 604 having crystal structure shown in FIG. 8B can be obtained.

Figure 8C:
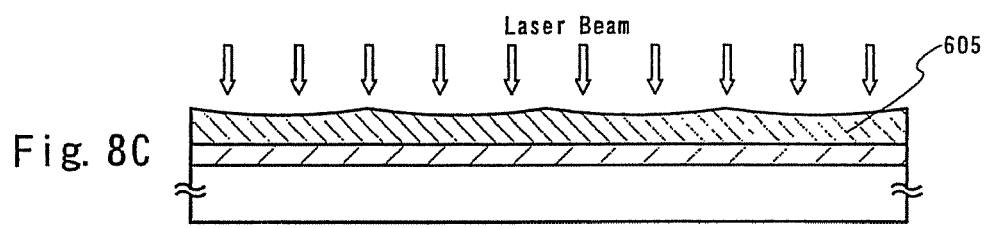

Further, in order to raise crystallinity (rate of crystal component to whole volume of the film) and to repair defect remained in crystal grain, it is effective too to radiate laser beam to the semiconductor film 604 having crystal structure as shown in FIG. 8C. Excimer laser beam less 400 nm wavelength, and a second and third harmonics of YAG laser are used for the laser. About any lasers, laser process to the semiconductor film 604 having crystal structure may be performed with overlap rate of 90 to 95% by using pulse laser beam of about 10 to 1000 Hz frequency and gathering the laser beams to 100 to 400 mJ/cm$^2$ by optical system.

In the semiconductor film (first semiconductor film) 605 having the crystal structure obtained by such the way, catalyst element (nickel here) is remained. It is remained in concentration more than $1 \times 10^{19}$/cm$^3$ as average concentration though it is not distributed uniformly in the film. Although various kinds of semiconductor elements, from TFT down, is possible to form in any state, the element is removed by gettering using the following method.

Figure 8D:
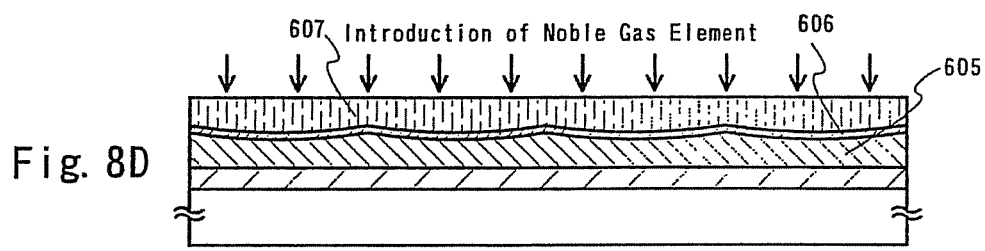
Figure 8E:
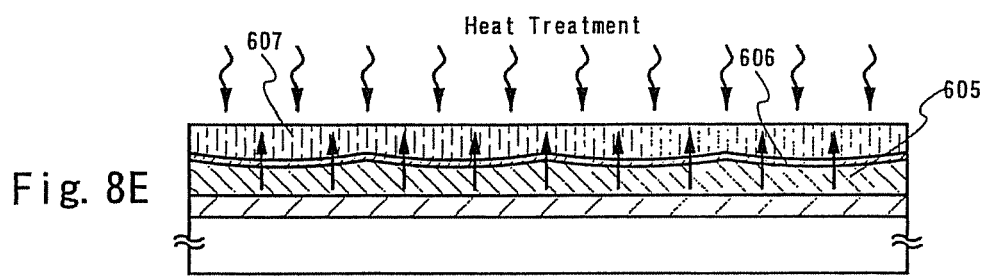

First, a thin barrier layer 606 is formed at surface of the semiconductor film 605 having the crystal structure as shown in FIG. 8D. Although thickness of the barrier layer is not especially limited, chemical oxide formed by processing simply with ozone water may be substituted for the barrier layer. By processing by aqueous solution mixing sulfuric acid, hydrochloric acid, and nitric acid and hydrogen peroxide, similarly the chemical oxide can be formed. As another method, plasma process in oxide atmosphere and oxide process generating ozone by ultraviolet irradiation in oxygen content atmosphere may be performed. Thin oxide film is formed heating about 200 to 350° C. using a clean oven so as to form a barrier. Oxide film of about 1 to 5 nm may be deposited by plasma CVD method, sputtering method, and deposition method so as to form a barrier layer.

On the barrier layer, a semiconductor film (second semiconductor film) 607 is formed to 25 to 250 nm thickness by plasma CVD method or sputtering method. Typically, amorphous silicon film is selected. Since the semiconductor film 607 is removed later, it is desirable to form low film in density because selecting ratio of etching to the semiconductor film 605 having crystal structure is raised. For example, at forming the amorphous silicon film by plasma CVD method, temperature of the substrate is set to 100 to 200° C., and hydrogen of 25 to 40 atomic percent is included in the film. It is similar at adopting sputtering method, temperature of the substrate is set less than 200° C., and a large quantity of hydrogen is included in the film by sputtering with mixed gas of argon and hydrogen. Noble gas element can be taken in the film at the same time by adding the noble gas element at forming film by sputtering method or plasma CVD method. By the noble gas element taken in such the way too, gettering site can be formed.

After that, the noble gas element is added to the semiconductor film 607 so as to include with density of $1 \times 10^{20}$ to $2.5 \times 10^{22}$/cm$^3$ by the ion doping method or the ion injection method. Although accelerating voltage is option, ion of the noble gas element injected because of the noble gas element passes through the semiconductor film 607 and the barrier layer 606, and a part of ion may reach the semiconductor film 605 having crystal structure. Since the noble gas element is inactive itself in semiconductor film, the gas does not very influence element characteristic even at area including with density of about $1 \times 10^{13}$ to $1 \times 10^{20}$/cm$^3$ close surface of the semiconductor film 605. The noble gas element may be added at step forming the semiconductor film 607.

For the noble gas element, one kind or plural kinds selected from helium (He), neon (Ne), argon (Ar), krypton (Kr), and xenon (Xe) is used. The noble gas element is used as ion source to form gettering site in the invention, and the gas is injected to the semiconductor film by ion doping method or ion injection method. Injecting ion of these noble gas elements has two meanings. One is to give distortion to the semiconductor by forming dangling bond using injection, and the other is to give distortion by injecting the ion between lattices of the semiconductor. Although ion injection of inactive gas satisfies the both at the same time, especially the latter one is obtained clearly when larger element in atomic radius than silicon such as argon (Ar), krypton (Kr), and xenon (Xe).

Figure 7:
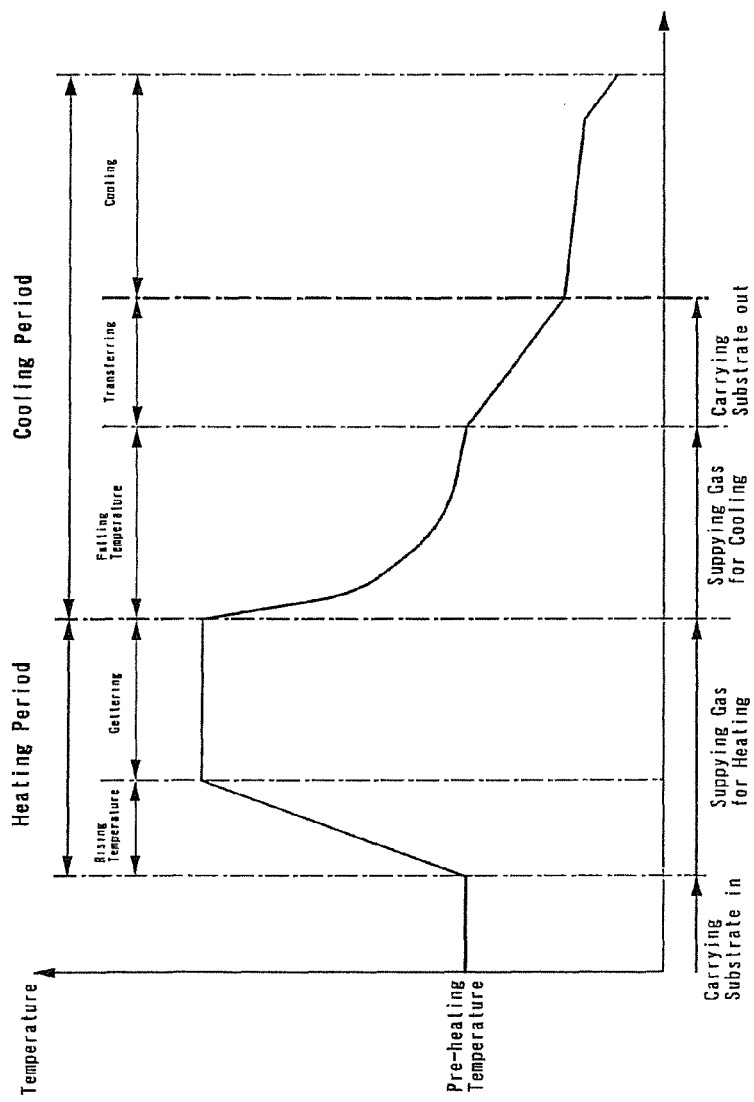
FIG. 7 is a graph describing change of substrate temperature at gettering process using method for heat-treating of the invention.

In order to achieve gettering surely, it is necessary to perform thermal treatment after that. FIG. 7 is a graph describing the process of thermal treatment, and the process of the thermal treatment will be described referring the graph. For the thermal treatment, the thermal treatment equipment of the invention is used similarly. It is desirable to use the equipment constructed like FIG. 5 in order to treat many substrates efficiently. Nitrogen and argon are used for heating gas.

The substrate 600 forming the construction of FIG. 8D is set in the reaction pipe from the cassette by the transferring unit, and after that, the gate valve is closed. During the time, it is considered that nitrogen is continued to supply from the gas-supplying unit in the reaction pipe and mixture of the air is made the minimum. After closing the gate valve, flowing quantity of the nitrogen is increased so as to substitute filling with nitrogen in the reaction pipe.

Then, increasing the flowing quantity of the nitrogen, nitrogen gas supplied by the gas-heating unit is heated to third temperature. The heating temperature can be adjusted by electric power supplying to a heating element or the power and supplying quantity of nitrogen. Here, setting to 675±25° C. as the third temperature, the substrate is heated (step of rising temperature shown in FIG. 7). Necessary time for raising to the temperature is two minutes.

When temperature of the substrate becomes the third temperature, the state is kept for three minutes. Thus, gettering is formed (step of gettering shown in FIG. 7). In the gettering, a catalyst element at a got area (getting site) is discharged by thermal energy and moves to gettering site by diffusion. Therefore, the gettering depends on process temperature, and for the shorter time the gettering advances at the higher temperature. Direction that catalyst element moves is distance of about thickness of the semiconductor film as shown with the arrow in FIG. 8E, and gettering is finished completely in comparatively short time.

After the predetermined time, supply of nitrogen gas for heating is stopped, and nitrogen gas for cooling is supplied. The gas may be nitrogen gas having room temperature. Then the substrate is cooled rapidly (step of falling temperature shown in FIG. 7). The time is about three minutes. After cooling the substrate to 300° C., the substrate is put out from the treatment room by the transferring unit, and is moved to a buffer cassette. Here, the substrate is further cooled to less than 150° C. (step of transfer shown in FIG. 7). After that, by transferring the substrate to the cassette, thermal treatment for gettering is finished.

Time from putting the substrate in the thermal treatment equipment to putting it out after heat-treating is 9 minutes. Thus, by using the thermal treatment equipment and the method for heat-treating of the invention, thermal treatment for gettering can be performed in very short time.

Even in the thermal treatment, the semiconductor film 607 including noble gas element with density of more than $1 \times 10^{20}/cm^3$ does not crystallize. This is considered that the noble gas element remains in the film without being re-discharged even in the range of the above-mentioned treating temperature and blocks crystallization of the semiconductor film.

After that, the amorphous semiconductor 607 is removed by etching selectively. Using dry etching by $ClF_3$ not using plasma or aqueous solution including density of 20 to 30%, desirably 25%, of hydrazine or tetraethyl-ammonium-hydro-oxide (chemical formula $(CH_3)_4NOH$) as etching method, the semiconductor can be easily removed by heating to 50° C. At this time, the barrier layer 606 functions as an etching stopper, and remains without almost being etched. The barrier layer 606 may be removed by hydrofluoric acid after that.

Figure 8F:
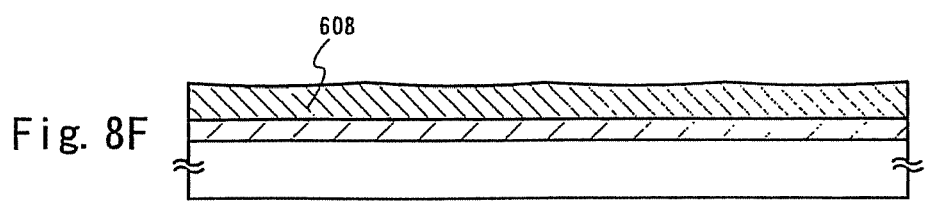

Thus, a semiconductor film 608 having crystal structure where density of catalyst element is reduced to less than $1 \times 10^{17}/cm^3$ can be obtained as shown in FIG. 8F. The semiconductor film 608 having crystal structure formed by such the way is formed as a thin bar or a thin flat bar type crystal by effect of catalyst element, and each crystal grows to a particular direction macroscopically. The semiconductor film 608 having such the crystal structure is applied not only for the active layer of TFT but also for a photoelectric transfer layer of photo sensor and solar battery.

Embodiment 3

A method producing a TFT using the semiconductor film produced by Embodiment 2 will be described referring FIG. 9. In the process producing the TFT described in the embodiment, the method for heat-treating and the thermal treatment equipment of the invention is used.

Figure 9A:
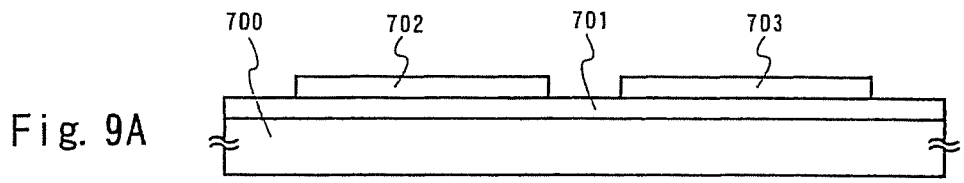
FIGS. 9A to 9F are sectional views describing process showing producing TFT applying the method for heat-treating and thermal treatment equipment of the invention.

First, in FIG. 9A, semiconductor films 702 and 703 separated in island shape are formed on a transparent substrate 700 made of alumino-borosilcate glass or barium-borosilicate glass by the semiconductor film produced in Embodiment 2. A first insulation film 701 of 50 to 200 nm thickness combined with one or plural kind selected from silicon nitride, silicon oxide, and silicon nitride oxide is formed between the substrate 700 and the semiconductor film.

Figure 9B:
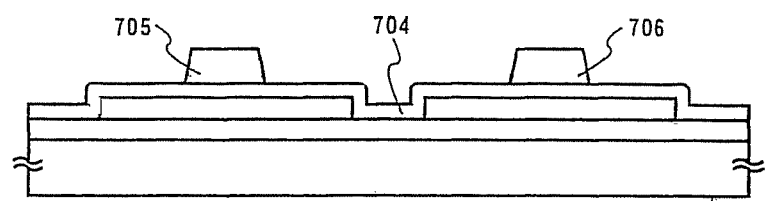

After that, a second insulation film 704 of 80 nm thickness is formed as shown in FIG. 9B. The second insulation film 704 is used as a gate insulation film and is formed using plasma CVD method or sputtering method. Silicon oxide nitride film produced by adding $O_2$ to $SiH_4$ and $N_2O$ is possible to reduce fixed density of electric charge in the film for second insulation film 704, it is desirable for the gate insulation film. Insulation film such as silicon oxide film and tantalum oxide film may be used for the gate insulation film as single layer or laminating layer structure without limiting to such the silicon oxide nitride film.

A first conductive film for forming a gate electrode on the second insulation film 704 is formed. Although there is no limitation of kind of the first conductive film, conductive material such as aluminum, tantalum, titanium, tungsten, and molybdenum or alloy of them are applied. For the structure of the gate electrode using such the material, laminating structure of tantalum nitride or titanium nitride, and tungsten or molybdenum tungsten alloy, and laminating structure of tungsten, and aluminum or copper are adopted. At using aluminum, matter added with titanium, scandium, neodymium, silicon, and copper of 0.1 to 7 weight % is used in order to raise heat resistance. The first conductive film of 300 nm thickness is formed.

After that, forming a resist pattern, gate electrodes 705 and 706 are formed. Wiring connecting to the gate electrodes is formed at the same time though it is not shown.

Figure 9C:
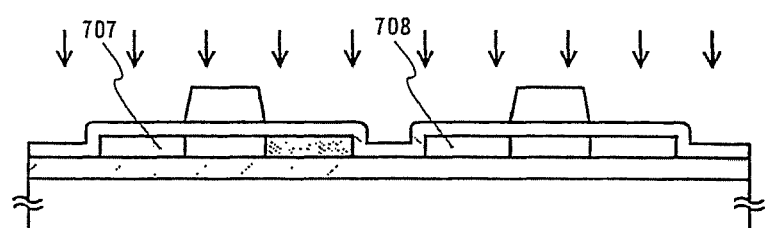

Masking the gate electrodes, an n type semiconductor domain is formed with self-matching as shown in FIG. 9C. Phosphorus is injected by ion injecting method or ion doping method (here, method injecting ion not separating mass) in doping. Phosphorus density of the domain is set within the range of $1 \times 10^{20}$ to $1 \times 10^{21}/cm^3$.

Figure 9D:
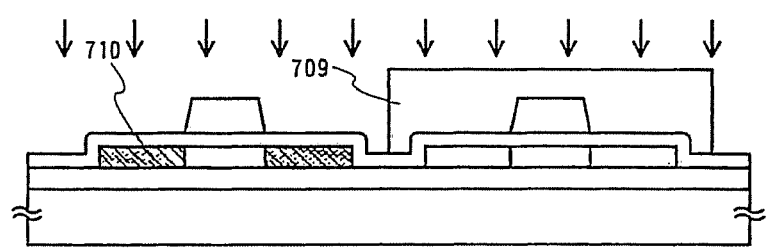

Next, a mask 709 covering one of the semiconductor films 703 is formed, and a p type semiconductor domain 710 is formed on the semiconductor film 702 as shown in FIG. 9D.

Boron is used for adding impurity, and is added with density of 1.5 to 3 times as much as phosphorus in order to invert n type. Phosphorus density of the domain is set within the range of $1.5 \times 10^{20}$ to $3 \times 10^{21}$/cm$^3$.

Figure 9E:
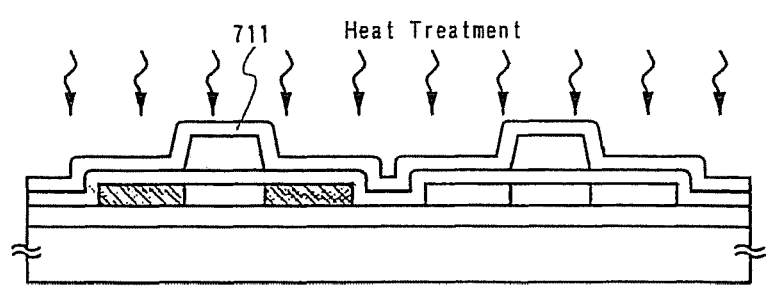

After that, a third insulation film 711 of 50 nm thickness made of silicon oxide nitride film or silicon nitride film is formed by plasma CVD method as shown in FIG. 9E.

Then, recovery of crystallization of n type and p type semiconductor domains and thermal treatment for activation are performed. The thermal treatment is performed similarly as FIG. 7 of Embodiment 2. Fourth temperature suitable for the activation is set to 450±50° C., and thermal treatment of 1 to 10 minutes may be performed.

Nitrogen and argon are used for heating gas. Thermal treatment of three minute is performed heating gas to temperature of 500° C. for activation. The gas may be reducing atmosphere added to the gas with hydrogen. Hydrogenation can be performed at the same time by added hydrogen.

The substrate is moved to a preparatory heating room from a cassette by a transferring unit, and is heated previously to the predetermined temperature. After that, moving the substrate to a treatment room, a gate valve is closed. After closing the gate valve, letting heated nitrogen flow and filling in a reaction room with nitrogen, the substrate is heated. Time from putting the substrate in the treatment room to putting it out after heat-treating is about 8 to 9 minutes supposing 2 minutes for rising temperature and 3 minutes for cooling. Thus, by using the thermal treatment equipment and the method for heat-treating of the invention, thermal treatment for activation can be performed in very short time.

When thermal treatment by RTA method is performed at the state forming gate electrodes on a glass substrate, the glass substrate is possibly damaged because the gate electrodes absorb selectively radiation of light of lamp and the substrate is heated. The thermal treatment according to the invention is not influenced because of heating by gas.

Figure 9F:
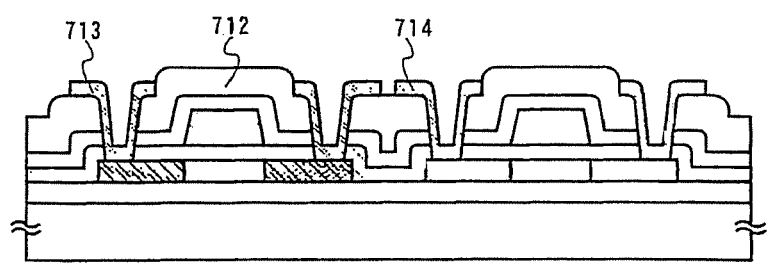

A fourth insulation film 712 shown in FIG. 9F is formed of silicon oxide film and silicon oxide nitride. The insulation film may be formed by organic insulation material such as polyimide or acryl, and surface thereof may be flattened.

Next, a contact hole reaching impurity domain of each semiconductor film from surface of the fourth insulation film 712 is formed, and wiring is formed using Al, Ti, and Ta. In FIG. 9F, symbols 713 and 714 function as a source wire or a drain electrode. Thus, an n channel type TFT and a p channel type TFT are formed. Although each TFT is shown as a simple substance, a CMOS circuit, an NMOS circuit, and a PMOS circuit are formed using these TFTs.

Embodiment 4

It is possible to form an oxide film on the surface of a semiconductor by mixing an inert gas for heating with a gas selected from the group consisting of oxygen, nitrous oxide, and nitrogen dioxide, and using this as an oxidizing gas in a heat treatment method, and a heat treatment apparatus applying the heat treatment method, of the present invention.

Figure 10A:
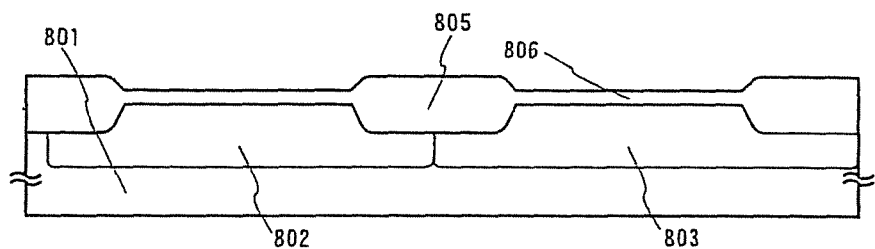
FIGS. 10A-10C are sectional views describing process showing producing an oxide film on a surface of a semiconductor applying the method for heat-treating and thermal treatment equipment of the invention.
Figure 10B:
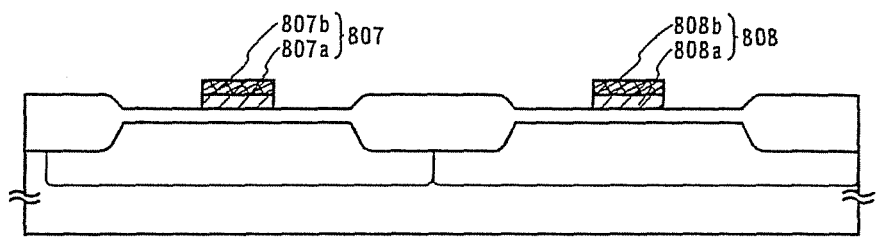
Figure 10C:
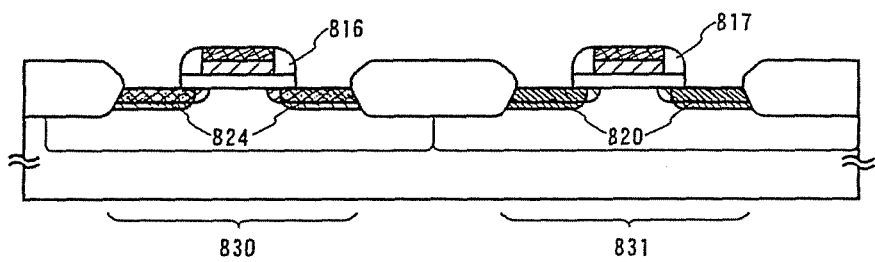

FIGS. 10A to 10C show such an example, and between 1 and 30% of oxygen is mixed with nitrogen used as a heating gas. By performing heat treatment at a temperature of 700 to 850° C., a field oxide film for element separation, and a gate insulating film can be formed on a single crystal silicon substrate.

An n-well 802 and a p-well 803 are formed in a substrate 801 made from single crystal silicon having a relatively high resistance (for example, n-type, on the order of 10 Ωcm) in FIG. 10A. Next, a field oxide film 805 is formed using the heat treatment method of the present invention and using a mixed gas of oxygen and nitrogen as a heating gas. Boron (B) may be introduced into the semiconductor substrate by selective ion injection of boron at this point to form a channel stopper. The heat treatment temperature is set from 700 to 850° C.

Formation of a silicon oxide film 806 that becomes a gate insulating film is then, similarly performed. An apparatus having the structure shown by FIG. 1 may be used as the apparatus employed in forming the field oxide film 805 and the silicon oxide film 806.

Next, as shown by FIG. 10B, a polycrystalline silicon film used for gates is formed having a thickness of 100 to 300 nm using CVD. The polycrystalline silicon film used for gates may be doped in advance by phosphorous (P) having a concentration on the order of $10^{21}$/cm$^3$ in order to lower its resistance, and a strong n-type impurity may also be diffused after forming the polycrystalline silicon film. A silicide film is formed having a thickness of 50 to 300 nm here on this polycrystalline silicon film in order to additionally lower the resistance. It is possible to apply materials such as molybdenum silicide (MoSix), tungsten silicide (WSix), tantalum silicide (TaSix), and titanium silicide (TiSix) as the silicide material, and the film may be formed in accordance with a known method. The polycrystalline silicon film and the silicide film are then etched, forming gates 807 and 808. The gates 807 and 808 have a two-layer structure from polycrystalline silicon films 807a and 808a, and silicide films 807b and 808b, respectively.

Source and drain regions 820 of an n-channel MOS transistor, and source and drain regions 824 of a p-channel MOS transistor are then formed as shown in FIG. 10C by ion injection. The heat treatment method and the heat treatment apparatus of the present invention can of course be used in order to perform recrystallization and activation of these sources and drain regions. The heat treatment temperature is set from 700 to 850° C., preferably so as to become 850° C., and heat treatment is performed by a heat treatment means and employing the gas used for heating. Impurities can be activated, and the source and drain regions can be made lower resistance by this heat treatment process.

An n-channel MOS transistor 831 and a p-channel MOS transistor 830 can thus be completed. The structure of the transistors explained in Embodiment mode is only one example, and it is not necessary to place limitations on the manufacturing processes and the structures shown in FIGS. 10A to 10C. CMOS circuits, NMOS circuits, and PMOS circuits can be formed using these transistors. Further, it is possible to form various types of circuits, such as shift registers, buffers, sampling circuits, D/A converters, and latches by using the transistors, and semiconductor devices such as memories, CPUs, gate arrays, and RISC processors can be manufactured. High-speed operation is possible for these circuits due to the MOS structure, and further, they can be made to have lower electric power consumption by using a driver voltage from 3 to 5 V.

As described above, according to the invention, a strong suscepter is needless by sheet process even when the treated substrate is large, making small can be designed for the size without limitation of a shape of the treated substrate or a size. Since the method for heat-treating and the thermal treatment equipment applying the method of the invention is a batch process system and a system heating the treated substrate by heated gas, thermal treatment is performed uniformly even when size of the substrate is large, and it is applicable even for thermal treatment of the substrate longer than 1000 mm in length of one side. A large scale heating unit for the substrate is needless. By providing the preparatory heating room and the cooling room, preparatory heating and cooling are possible to perform at the same time, thereby number of sheets treated per unit time is increased.

The method for heat-treating of the invention can apply for thermal treatment of semiconductor substrate forming an integrated circuit, thermal treatment of an insulation substrate forming a TFT, and thermal treatment of a metal substrate. For example, it is applied for thermal treatment of a large size mother glass substrate forming a TFT. It is needless to make the jig holding the substrate large. Further, crystallization of the amorphous semiconductor film, gettering, activation of impurity, hydrogenation, and oxidation of semiconductor surface are performed in short time. Such the processes can be taken in manufacturing process of the semiconductor element.

What is claimed is:

1. A method for manufacturing a semiconductor device, comprising the steps of:
    preparing a single crystalline substrate;
    forming a p-well and an n-well in the single crystalline substrate;
    forming a field oxidation film by applying a first heating gas to the single crystalline substrate;
    applying a first cooling gas to the single crystalline substrate after applying the first heating gas;
    forming a gate insulating film by applying a second heating gas to the single crystalline substrate;
    applying a second cooling gas to the single crystalline substrate after applying the second heating gas;
    forming a gate electrode over the gate insulating film;
    forming a source region and a drain region in the p-well and the n-well by implanting ion species;
    activating the source region and the drain region for applying a third heating gas to the single crystalline substrate; and
    applying a third cooling gas to the single crystalline substrate after applying the third heating gas.

2. A method for manufacturing a semiconductor device according to claim 1, wherein the first heating gas and the second heating gas comprise oxygen and an inert gas.

3. A method for manufacturing a semiconductor device according to claim 1, wherein the third heating gas comprises an inert gas.

4. A method for manufacturing a semiconductor device according to claim 1, wherein a temperature of the first heating gas and the second heating gas is 700° C. or more and 850° C. or less.

5. A method for manufacturing a semiconductor device according to claim 1, wherein a temperature of the third heating gas is 700° C. or more and 850° C. or less.

6. A method for manufacturing a semiconductor device, comprising the steps of:
    preparing a single crystalline substrate;
    forming a p-well and an n-well in the single crystalline substrate;
    forming a field oxidation film by applying a first heating gas to the single crystalline substrate;
    applying a first cooling gas to the single crystalline substrate after applying the first heating gas;
    forming a gate insulating film by applying a second heating gas to the single crystalline substrate;
    applying a second cooling gas to the single crystalline substrate after applying the second heating gas;
    forming a first gate electrode over the gate insulating film;
    forming a second gate electrode over the first gate electrode;
    forming a source region and a drain region in the p-well and the n-well by implanting ion species;
    applying a third heating gas to the single crystalline substrate to activate the source region and the drain region; and
    applying a third cooling gas to the single crystalline substrate after applying the third heating gas.

7. A method for manufacturing a semiconductor device according to claim 6, wherein the first heating gas and the second heating gas comprise oxygen and an inert gas.

8. A method for manufacturing a semiconductor device according to claim 6, wherein the third heating gas comprises an inert gas.

9. A method for manufacturing a semiconductor device according to claim 6, wherein a temperature of the first heating gas and the second heating gas is 700° C. or more and 850° C. or less.

10. A method for manufacturing a semiconductor device according to claim 6, wherein a temperature of the third heating gas is 700° C. or more and 850° C. or less.

11. A method for manufacturing a semiconductor device according to claim 6,
    wherein the first gate electrode comprises a doped silicon, and
    wherein the second gate electrode comprises any one selected from the group consisting of molybdenum silicide (MoSix), tungsten silicide (WSix), tantalum silicide (TaSix) and titanium silicide (TiSix).

* * * * *